(12) United States Patent  (10) Patent No.: US 7,643,207 B2
Dagens et al.  (45) Date of Patent: Jan. 5, 2010

(54) SEMICONDUCTOR OPTICAL AMPLIFIER WITH LATERAL AND DISTRIBUTED GAIN STABILISATION

(75) Inventors: Beatrice Dagens, Antony (FR); Romain Brenot, Paris (FR); Guang-Hua Duan, Chatenay Malabry (FR); Thierry Hessler, St-Aubin (CH)

(73) Assignee: Avanex Corporation, Fremont, CA (US)

( * ) Notice: Subject to any disclaimer, the term of this patent is extended or adjusted under 35 U.S.C. 154(b) by 630 days.

(21) Appl. No.: 10/530,690

(22) PCT Filed: Oct. 10, 2003

(86) PCT No.: PCT/IB03/05041

§ 371 (c)(1),
(2), (4) Date: Apr. 9, 2005

(87) PCT Pub. No.: WO2004/036702

PCT Pub. Date: Apr. 29, 2004

(65) Prior Publication Data

US 2005/0259317 A1    Nov. 24, 2005

(30) Foreign Application Priority Data

Oct. 15, 2002   (FR)   ................................. 02 12825

(51) Int. Cl.
*H04B 10/17* (2006.01)
(52) U.S. Cl. ..................... 359/344; 372/97; 372/50.121
(58) Field of Classification Search ................... 372/97, 372/50.121, 50.122, 50.22, 40.011
See application file for complete search history.

(56) References Cited

U.S. PATENT DOCUMENTS

| | | | | |
|---|---|---|---|---|
| 3,265,988 A | * | 8/1966 | Dayem et al. | 331/94.1 |
| 3,414,840 A | * | 12/1968 | Domenico, Jr. et al. | 372/97 |
| 3,432,767 A | * | 3/1969 | Pole et al. | 372/24 |
| 3,614,659 A | * | 10/1971 | Rigrod | 372/97 |
| 3,736,526 A | * | 5/1973 | Simmons | 372/18 |
| 3,808,550 A | * | 4/1974 | Ashkin | 372/97 |
| 3,969,684 A | * | 7/1976 | de Witte et al. | 372/25 |
| 4,156,852 A | * | 5/1979 | Hagen | 359/348 |
| 4,847,521 A | * | 7/1989 | Huignard et al. | 359/344 |
| 5,119,389 A | * | 6/1992 | Amano | 372/23 |
| 5,138,628 A | * | 8/1992 | Pocholle et al. | 372/99 |
| 5,257,275 A | * | 10/1993 | Trussell et al. | 372/23 |

(Continued)

OTHER PUBLICATIONS

L B Soldano and E C M Pennings 'Optical multimode interference devices based on self-imaging: principles and applications' Journal of Lightwave Technology, vol. 13, No. 4, Apr. 1995, pp. 615-627.*

(Continued)

*Primary Examiner*—Jack Keith
*Assistant Examiner*—Ari M. Diacou
(74) *Attorney, Agent, or Firm*—Patterson & Sheridan, L.L.P.

(57) ABSTRACT

A stabilised gain semiconductor optical amplifier (CG-SOA) includes and active waveguide (1) comprising an amplification medium (2), extending in longitudinal (Z), lateral (X) and vertical (Y) directions, and coupled to a laser oscillation structure comprising at least two resonant cavities (13, 14) extending in first (D1) and second (D2) directions which are different from the longitudinal direction (Z) of the active waveguide (1) and arranged in such a way as to permit the establishment of laser oscillations having at least two different relaxation oscillation frequencies.

6 Claims, 4 Drawing Sheets

U.S. PATENT DOCUMENTS

| | | | |
|---|---|---|---|
| 5,307,369 A * | 4/1994 | Kimberlin | 372/108 |
| 5,436,759 A | 7/1995 | Dijaili et al. | |
| 5,651,019 A * | 7/1997 | Goldberg et al. | 372/68 |
| 5,684,817 A * | 11/1997 | Houdre et al. | 372/45.01 |
| 5,737,352 A * | 4/1998 | Tiemeijer et al. | 372/50.22 |
| 5,848,090 A * | 12/1998 | Zoll et al. | 372/93 |
| 5,955,749 A * | 9/1999 | Joannopoulos et al. | 257/98 |
| 6,195,483 B1 * | 2/2001 | Moon et al. | 385/37 |
| 6,292,504 B1 * | 9/2001 | Halmos | 372/97 |
| 6,347,104 B1 | 2/2002 | Dijaili et al. | |
| 6,553,162 B1 * | 4/2003 | Okayama | 385/37 |
| 6,714,567 B2 * | 3/2004 | Masuda | 372/21 |
| 6,714,568 B2 * | 3/2004 | Hunt | 372/21 |
| 7,113,526 B2 * | 9/2006 | Evans et al. | 372/23 |
| 2002/0048078 A1 * | 4/2002 | Schiller | 359/330 |
| 2003/0053511 A1 * | 3/2003 | Baillargeon et al. | 372/97 |
| 2004/0013157 A1 * | 1/2004 | Deng et al. | 372/97 |
| 2004/0032895 A1 * | 2/2004 | Okada et al. | 372/50 |
| 2005/0111511 A1 * | 5/2005 | Assefa et al. | 372/92 |

OTHER PUBLICATIONS

Laser. From Wikipedia, the free encyclopedia. Revision as of 04:01, Jul. 27, 2006. DL: Jul. 27 ,2006.*

Laser. From Wikipedia, the free encyclopedia. Revision as of 07:40, Apr. 3, 2004; DL: Jul. 27, 2006.*

Modelocking. From Wikipedia, the free encyclopedia. Revision as of 08:07, Jan. 2, 2004; DL: Jul. 28, 2006.*

Relaxation oscillations. Encyclopedia of Laser Physics and Technology. RP Photonics consulting. DL: Jul. 27, 2006.*

P. Doussiere, A. Jourdan, G. Soulage, P. Garabedian, C. Graver, T. Fillion, E. Derouin, and D. Leclerc, Clamped Gain Travelling Wave Semiconductor Optical Amplifier for Wavelength Division Multiplexing Applications, Proceedings of the International Semiconductor Laser Conference, Mauri, Hawaii, Sep. 19-23, 1994, New York, IEEE, U.S., vol. Conf. 14, Sep. 10, 1994 (Sep. 19, 1994), pp. 185-186, XP000514864, ISBN: 0-7803-1755-6 the whole document.

PCT Search Report, International Application No. PCT/IB03/05041. dated May 12, 2004.

* cited by examiner

FIG.1
Art

SEMICONDUCTOR OPTICAL AMPLIFIER WITH LATERAL AND DISTRIBUTED GAIN STABILISATION

The present invention concerns the field of optical devices and more particularly that of stabilized gain semiconductor optical amplifiers, better known by the English acronym CG-SOA (standing for 'Clamped Gain-Semiconductor Optical Amplifier').

Figure 1:
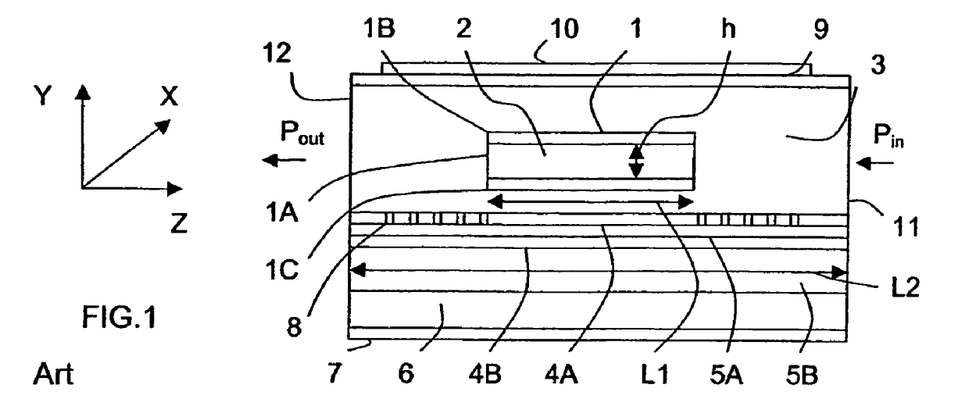
FIG. 1 is a diagrammatic view in cross-section in the plane (YZ) of a CG-SOA of the prior art, FIG. 2 diagrammatically illustrates a first embodiment of a CG-SOA according to the invention in a view in cross-section in the plane (ZX), FIG. 3 diagrammatically shows a first variant of the embodiment of FIG. 2 in a view in the plane (ZX), FIG. 4 diagrammatically shows a second variant of the embodiment of FIG. 2 in a view in the plane (ZX)

Optical amplifiers known as CG-SOAs are semiconductor structures which comprise an active waveguide, which is possibly tapered, extending in a longitudinal direction and coupled, as shown in FIG. 1, to a resonant cavity formed by at least one distributed Bragg lattice or grating (referred to as DBR standing for 'Distributed Bragg Reflector'), placed at one longitudinal end of the active waveguide, substantially perpendicularly to the longitudinal axis Z. That coupling induces laser oscillations which make it possible to stabilise the carrier density of the structure and consequently its gain. By virtue of that stabilisation of the carrier density it is possible to suppress the gain variations which normally occur in conventional optical amplifiers in the presence of variations in the input power. The gain can thus remain substantially constant over a wide range of operating parameters such as input power, output power and control current. In addition, in contrast to conventional amplifiers, CG-SOAs have a reduced level of crosstalk. They are consequently particularly well suited for optical switching by wavelength multiplexing (or WDM standing for 'Wavelength Division Multiplexing').

However, by virtue of the fact that it is the accumulated gain along the longitudinal direction and not the gain at every point in the longitudinal direction which is stabilised by the laser effect, and by virtue of the fact that they have a relaxation oscillation frequency which does not exceed some gigahertz (Hz), those CG-SOAs permit a reduction in crosstalk only for low rates of typically less than 1 Gbits/s. Beyond those rates crosstalk becomes preponderant again.

To remedy that disadvantage, a new structure has recently been proposed, which is referred to as a linear optical amplifier (or LOA standing for 'Linear Optical Amplifier'). That structure comprises a very long VCSEL 'Vertical Cavity Surface Emitting Laser'), permitting stabilisation of the gain vertically while substantially reducing crosstalk, including at a high rate.

However, the implementation of that type of structure is particularly complex, in particular by virtue of the fact that it necessitates vertical mirrors and a horizontal SOA structure. In addition that type of structure is a current consumer by virtue of the fact that the control current has to pass through at least one Bragg mirror.

Therefore the object of the invention is to remedy all or part of the above-mentioned disadvantages.

For that purpose it proposes a stabilised gain semiconductor optical amplifier (or CG-SOA), including an active waveguide comprising an amplification medium and coupled to a laser oscillation structure.

By definition it is considered that the structure of the optical amplifier extends in three mutually perpendicular directions, a direction referred to as the 'longitudinal' direction (Z), defining the longitudinal axis of the optical amplifier (and consequently its longitudinal extent (or length)), a direction referred to as the 'lateral' direction (X), defining the lateral extent (or width) of the optical amplifier, and a direction referred to as the 'vertical' direction (Y), defining the direction of stacking of the layers and the vertical extent (height) of the active waveguide.

That optical amplifier of CG-SOA type is characterised in that its laser oscillation structure comprises at least two resonant cavities extending in first and second directions which are different from the longitudinal direction (Z) of the active waveguide and arranged in such a way as to permit the establishment of laser oscillations having at least two different relaxation oscillation frequencies.

In a first embodiment the resonant cavities are preferably defined by distributed Bragg reflectors (of type DBR for 'Distributed Bragg Reflector') and are of different optical path lengths and/or are associated with different wavelengths.

The resonant cavities and the active waveguide may share a part at least of the amplification medium. In an alternative configuration however the resonant cavities may involve first and second directions which are substantially mutually parallel and substantially perpendicular to the longitudinal direction (Z). In that case the resonant cavities share different portions of the amplification medium of the active waveguide.

Moreover one at least of the resonant cavities may comprise an amplification structure involving multi-mode interference (or MMI standing for 'Multi-Mode Interference'). In the multi-mode zones the active guide being wider, the transverse laser cavity is therefore longer, which makes it possible to relieve the constraints on the reflection coefficient of the transverse DBRs, which is involved in establishment of the laser effect.

Such resonant cavities can be formed either at the level of the amplification medium in a passive waveguide disposed on respective sides of the longitudinal sides of the active waveguide, or in a passive waveguide disposed below the active waveguide and on respective sides of the longitudinal sides of the latter.

In a second embodiment the resonant cavities are defined by a structuring formed along the longitudinal sides of the active waveguide which are parallel to the longitudinal direction (Z) and having at least one forbidden photonic band comprising at least two different reflection directions for a wavelength contained in the amplification band of the active waveguide (at that wavelength the photons are in the guided mode).

The expression 'structuring formed along the longitudinal sides of the active waveguide' means that the structuring extends over the entire length L of the active region of the optical amplifier or over a part thereof substantially in parallel relationship with a plane defined by the vertical (Y) and longitudinal (Z) directions. Moreover the term 'structuring with a forbidden photonic band' is used here to denote a n-dimensional lattice (n being preferably equal to 2 but it can also be equal to 1 or 3), the physical properties of which afford control of the propagation of light, which can go as far as prohibiting it for certain wavelengths in certain directions in space.

Preferably also the structuring substantially defines a photonic crystal of holes or columns which constitute diffracting elements. The pitch or the mesh of that photonic crystal involves dimensions of the order of the wavelength (of operation) of the photons in the guided mode, which flow in the active waveguide. For example in InP the pitch is of the order of 400 nm for an operating wavelength of about 1500 nm. Still more preferably the holes or columns extend substantially parallel to the direction (Y) of stacking of the layers.

Moreover the photonic crystal is a structure of which the base 'cell' is preferably a triangle or a square. The air filling factor of that structure, which is defined as the ratio between the surface area of the holes and the total surface area, is preferably of the order of about 35%.

In addition in this second embodiment lateral guidance can be effected in the same manner as in a conventional strip or by the photonic crystal structure when one or more rows of holes is removed therefrom.

Other features and advantages of the invention will be apparent from the detailed description set forth hereinafter and the accompanying drawings in which:

The dimensions of the different elements constituting the CG-SOAs illustrated in the Figures are not representative of their respective actual dimensions.

The reference system (X, Y, Z) illustrated in FIGS. 1 to 8 defines the perpendicular directions along which the structure forming a CG-SOA extends. The axis Z defines the longitudinal direction of the optical amplifier or in other words its length. The axis X defines the lateral direction of the optical amplifier or in other words its width. And the axis Y defines the vertical direction of stacking of the layers (by convention the bottom of FIG. 1 is referred to as the 'lower part' of the optical amplifier and the top of FIG. 1 is referred to as the 'upper part' of the optical amplifier).

Reference will firstly be made to FIG. 1 to describe an example of a CG-SOA of the prior art.

Figure 2:
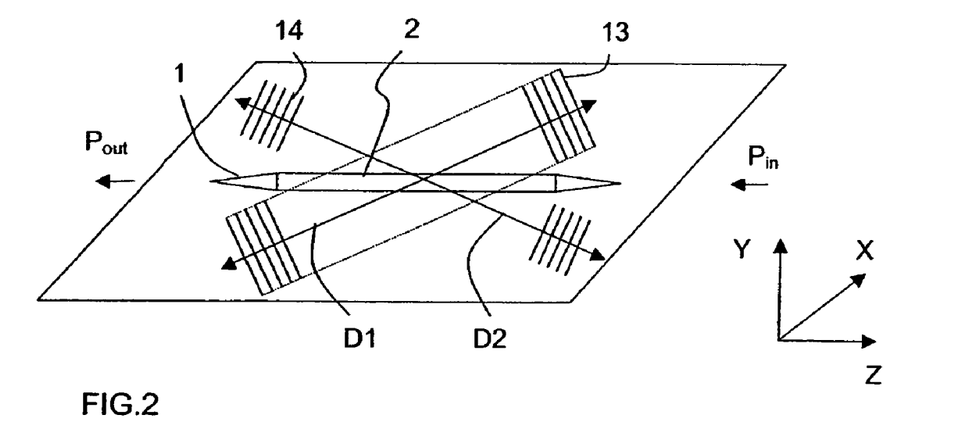
Figure 3:
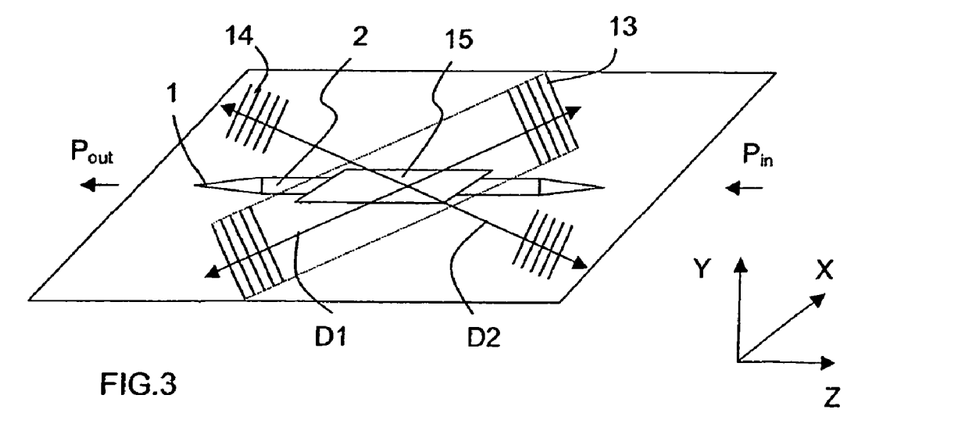
Figure 4:
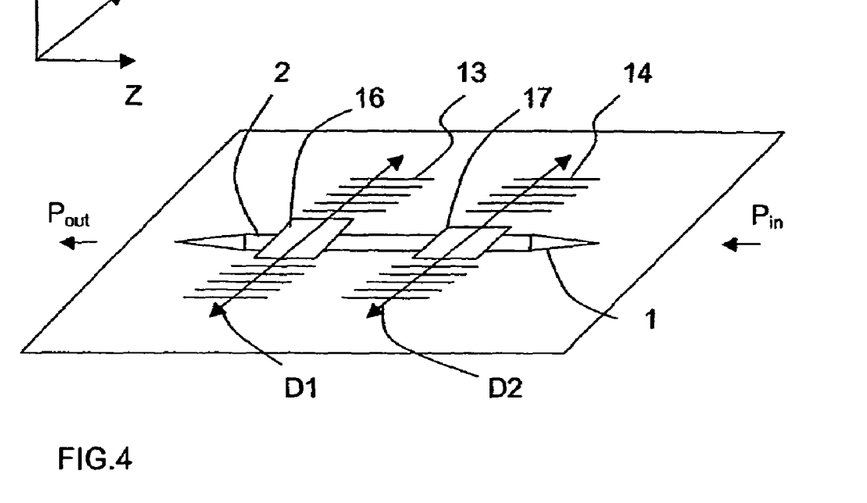

A CG-SOA firstly comprises an active waveguide 1 formed by a stack of layers of amplification semiconductor materials III-V as indicated at 2. For example the active waveguide 1 comprises a central layer 1A of undoped intrinsic InGaAsP having a forbidden band energy corresponding to a wavelength of about 1.55 µm and optionally interposed between two layers 1B and 1C of undoped intrinsic InGaAsP having a forbidden band energy corresponding to a wavelength of about 1.18 µm. That active waveguide 1 is in a band form of a height h (in the direction Y), a width l (in the direction X) and a length L1 (in the direction Z), the ends of which are possibly tapered (as illustrated in FIGS. 2 to 4).

The 'active' band 1 (which is optionally tapered) is generally buried in a semiconductor material III-V, referred to as the upper material 3, for example of P-doped InP. Moreover, it is possible to place below (or above) the active band 1, at a selected distance, a first passive waveguide 4A formed for example by a layer of doped InGaAsP having a forbidden band energy corresponding to a wavelength of about 1.18 µm. That first passive waveguide 4A is in the form of a 'passive' band whose lateral extent (in the direction X) is substantially equal to that (l) of the active band 1 but of which the length L2 (in the direction Z) is greater than L1. The first passive waveguide 4A and the upper material 3 in which the active waveguide 1 is buried rest on a layer of semiconductor material III-V, referred to as the intermediate layer 5A, for example of N-doped InP, below which there is optionally placed a second passive waveguide 4B which is substantially identical to the first passive waveguide 4A. The above-defined assembly rests on a lower layer 5B of the same type as the intermediate layer 5A and itself placed on a substrate 6 of semiconductor material III-V, for example of solid InP. Finally the lower face of the substrate 6 (opposite to the lower layer 5) is covered by a metallisation layer 7.

The active waveguide 1 is coupled to a resonant cavity delimited in this case by two distributed Bragg lattices (or DBR, for 'Distributed Bragg Reflector') 8 which are formed in the first passive waveguide 4A at the level of the two longitudinal ends of the active waveguide 1. Those distributed Bragg lattices 8 are for example formed by bands parallel to the lateral direction X and of semiconductor material III-V such as InGaAsP, of which the proportions and dimensions make it possible to fix the force of the Bragg lattice. Those Bragg lattices 8, with the amplification material 2 of the active waveguide 1, constitute a resonant cavity in which the laser effect is produced and which makes it possible to stabilise (or 'clamp') the carrier density of the structure and consequently its gain in the longitudinal direction Z.

In addition the upper face of the upper layer 3, in which the active waveguide 1 is buried, is covered with a terminal layer 9 of semiconductor material III-V, for example of InGaAs, and the upper face of that upper layer is covered by a metallisation layer 10 in the part which is disposed above the active waveguide 1. The metallisation layers 7 and 10 at the lower and upper ends of the structure permit a control current of a selected strength to be injected into the CG-SOA.

The longitudinal end faces 11 and 12 of the structure, which constitute the facets of the optical amplifier, are covered by an anti-reflecting layer (AR) which has substantially the same coefficient of reflection (for example lower than $10^{-3}$) in such a way as to minimise the reflection phenomena.

Finally in this type of structure forming an optical amplifier the input power $P_{in}$ is introduced by way of one of the longitudinal ends and the output power $P_{out}$ is collected at the opposite longitudinal end.

Reference will now be made to FIG. 2 to describe a first embodiment of a CG-SOA according to the invention.

The invention proposes a clamped gain semiconductor optical amplifier (or CG-SOA) which substantially adopts again the arrangement of the CG-SOAs of the prior art, as described hereinbefore with reference to FIG. 1, except for the laser oscillation structure.

In the illustrated example, there is provided only a single layer defining a single passive waveguide 4 and consequently in place of an intermediate layer 5A and a lower layer 5B the arrangement now only has a single layer 5. It will be appreciated however that it would be possible to retain the arrangement described with reference to FIG. 1 and comprising layers 4A, 4B, 5A and 5B.

Moreover the laser oscillation structure according to the invention is formed by at least two resonant cavities 13 and 14 which extend substantially at the same level at least in the passive waveguide 4 in first D1 and second D2 directions which are different from the longitudinal direction Z of the active waveguide 1.

Those two resonant cavities 13 and 14 are arranged in such a way as to permit the establishment of relaxation oscillations entailing at least two different frequencies to stabilise (or 'clamp') the carrier density. The relaxation oscillations of the different lasers of the structure, which provide for lateral distributed stabilisation of the gain, are thus out-of-phase and the sum of their contributions becomes substantially constant as a function of time. Consequently, the overall oscillations which are seen by the amplified waves which are propagated in the active waveguide 1 disappear.

More precisely when the carrier density N is subjected to a disturbance it varies in dependence on time in accordance with the following law:

$$dN(t) = dN_0 e^{-\gamma t/2} \cos(\omega_{osc} t)$$

in which $\omega_{osc}$ is the observed frequency of the relaxation oscillations defined by:

$$\omega_{osc} = \omega_R \sqrt{1 - \left(\frac{\gamma}{2\omega_R}\right)^2}.$$

The frequency $\omega_{osc}$ and the damping factor $\gamma$ can be modified by acting on the optical path length of the resonant cavity.

Now, when a plurality of lateral cavities generate laser oscillations the waves amplified in the optical amplifier pass through those cavities in succession. A variation in the input power creates oscillations of the carrier density in each cavity. By virtue of the fact that those cavities can involve oscillation frequencies and damping factors which are different, the cumulative amplification effect results in an output power of which the dynamics are less fluctuating. The waves amplified in the optical amplifier therefore see modulation of the carrier density dN which is a function of the mean value of those different oscillations.

The two resonant cavities 13 and 14 are preferably each defined by two Bragg reflectors of distributed Bragg lattice type (or DBR) which are disposed on respective sides of the longitudinal sides of the amplification medium 2 at least in a part of the passive waveguide 4 which is placed below (or, in an alternative configuration, above) same at a spacing, in the vertical direction Y, which is so selected as to permit coupling thereof to the amplification medium 2. For that purpose and in contrast to the CG-SOA of the prior art the passive waveguide 4 of the CG-SOA of the invention has a lateral extent l2 (in the direction X) which is very markedly greater than that (l1) of the active waveguide 1. The optical frequency of each laser is entirely determined by the pitch of the corresponding Bragg lattice.

The Bragg lattices not being buried, it is possible to achieve elevated levels of contrast. A reflectivity of 99% can thus be obtained with an amplification medium 2 involving a length of about 5 μm and a number of periods of the lattice equal to three for an index contrast of 1.0/3.22 or equal to four for an index contrast of 1.5/3.22 or equal to six for an index contrast of 2.0/3.22 or again equal to eleven for an index contrast of 2.5/3.22.

To obtain two different relaxation oscillation frequencies the resonant cavities 13 and 14 may involve different optical path lengths and/or may be formed differently in such a way as to be associated with different wavelengths.

In the example illustrated in FIG. 2 the two resonant cavities share substantially the same portion of the amplification medium 2 and have both different optical path lengths and different Bragg lattices associated with different wavelengths. In addition those two resonant cavities do not involve any phase relationship.

In order to avoid using excessively high control currents one at least of the resonant cavities 13 and 14 may involve an active length which is slightly increased by the expedient of a structure of type MMI for 'Multi-Mode Interference' which is placed along the active waveguide 1. That type of MMI structure is described in particular in the document by L B Soldano and E C M Pennings 'Optical multimode interference devices based on self-imaging: principles and applications' Journal of Lightwave Technology, Vol 13, No 4, April 1995, pages 615-627. Such a structure makes it possible in fact to enlarge the active guide over a given length while making it possible to obtain at the output of the MMI a monomode wave which is coupled without loss into the waveguide of the amplifier. That amounts to increasing the active surface area 15 and therefore the active length of the corresponding lasers. That alternative configuration of the CG-SOA of FIG. 2 is diagrammatically illustrated in FIG. 3.

In the two examples set forth hereinbefore with reference to FIGS. 2 and 3 the two resonant cavities 13 and 14 extend in directions D1 and D2 which are different from each other and different from the longitudinal direction Z of the active waveguide 1. In this case the angles between the directions D1 and Z on the one hand and D2 and Z on the other hand are acute and typically of the order of 30°. It is preferable to choose angles of a small value in such a way that the laser covers a substantial part of the active waveguide 1.

However, as illustrated in FIG. 4, the two resonant cavities 13 and 14 may extend in directions D1 and D2 which are substantially identical and therefore substantially perpendicular to the longitudinal direction Z of the active waveguide 1. In that variant of the embodiments of FIGS. 2 and 3 the two resonant cavities 13 and 14 involve substantially identical Bragg lattices and physical lengths but they comprise different structures of type MMI which induce different amplification surfaces 16 and 17 and therefore different optical path lengths, which is manifested by different relaxation oscillation frequencies. In addition, in this variant, the two cavities use totally different portions of amplification medium.

In another variant the two resonant cavities could comprise different Bragg lattices and/or could involve different physical lengths with or without a structure of type MMI, which are optionally different.

Figure 5:
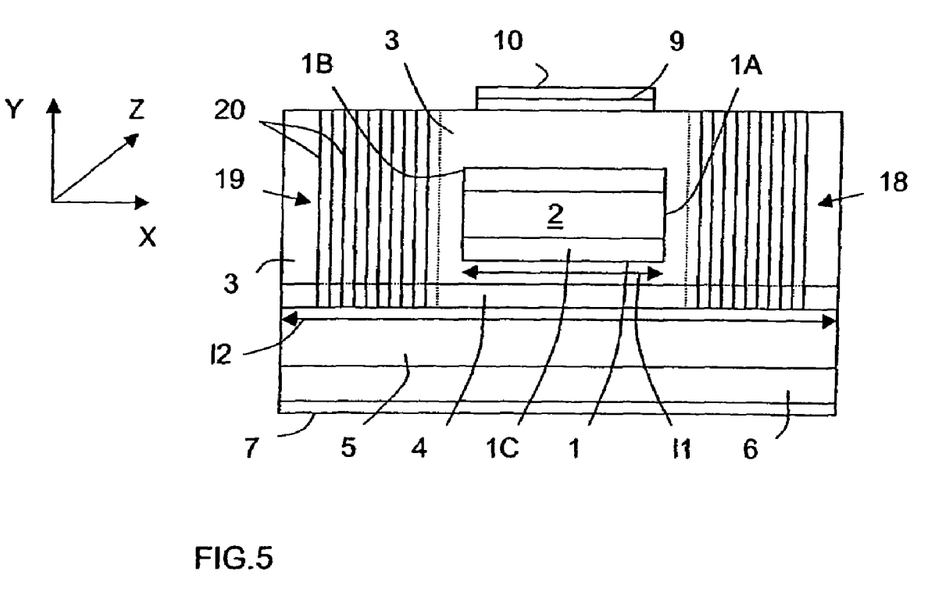
FIG. 5 is a diagrammatic view in cross-section in the plane (XY) of a second embodiment of a CG-SOA according to the invention, FIG. 6 diagrammatically illustrates the optical amplifier of FIG. 5 in a view in cross-section in the plane (ZX), FIG. 7 diagrammatically illustrates the two privileged reflection directions produced by a photonic crystal of the type used in the second embodiment of FIGS. 5 and 6.
Figure 6:
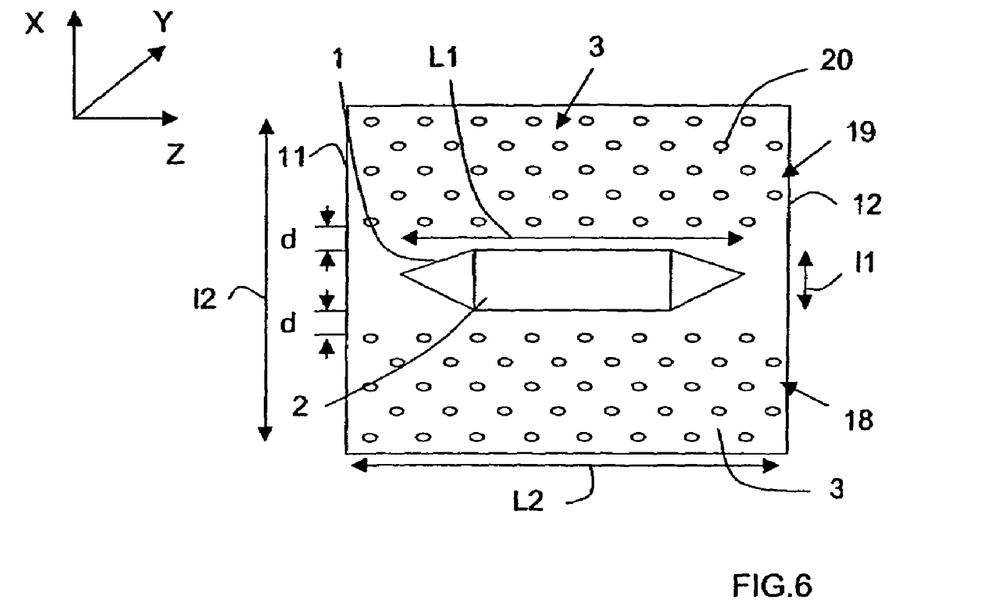
Figure 7:
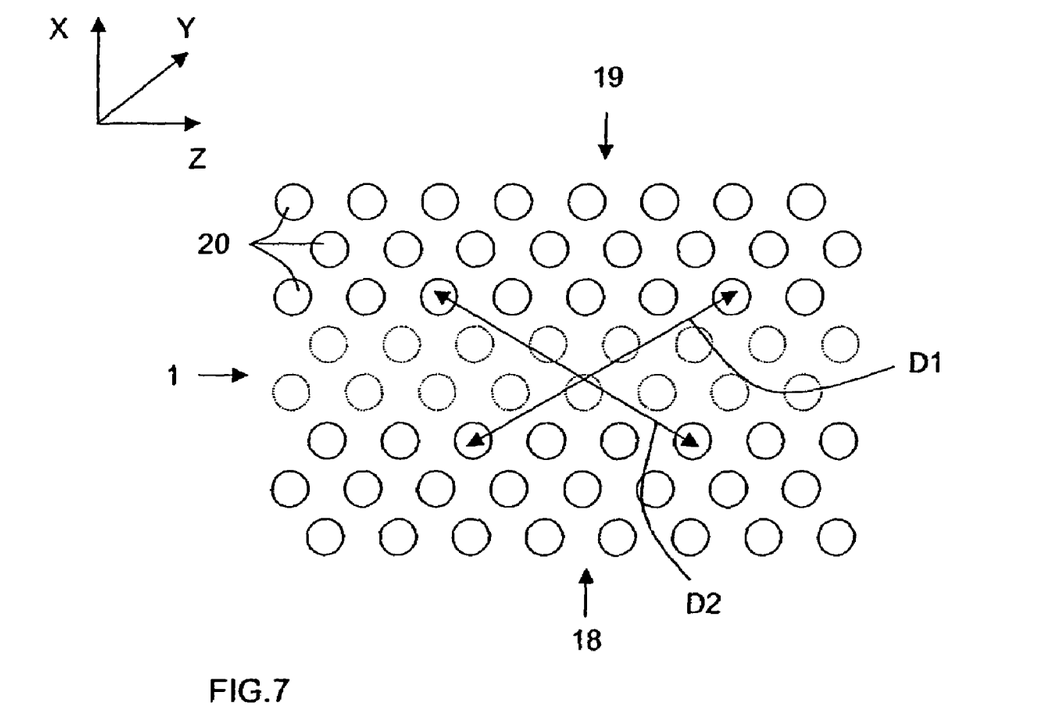

Reference will now be made to FIGS. 5 to 7 to describe another embodiment of a CG-SOA according to the invention.

This embodiment comprises a laser oscillation structure whose resonant cavities are greatly different from those set forth hereinbefore with reference to FIGS. 2 to 4.

The active waveguide 1 is here coupled to a distributed reflector in the form of two identical diffracting lattices 18 and 19 formed on respective sides of the longitudinal sides of the active waveguide 1, defined by the plane (YZ), in a part at least of the upper layer 3, in which the active waveguide 1 is buried, and in the passive waveguide 4. More precisely, for practical reasons related to the procedure involved in production of the diffracting lattices 18 and 19, they extend in the vertical direction Y over the entire height of the upper layer 3 which is placed above the lateral parts of the passive waveguide 4, which project on respective sides of the two longitudinal sides of the active waveguide 1.

Each diffracting lattice 18, 19 is here a particular structuring referred to as 'forbidden photonic band' of the upper layer 3 and of the passive waveguide 4. Hereinafter a diffracting lattice is deemed equivalent to its structuring.

That type of n-dimensional lattice (n preferably being equal to 2 but it can also be equal to 1 or 3) is well known to the man skilled in the art. It is described in particular in the document by E Yablanovitch, J opt Soc Am B 10, 283 (1993), 'photonic bandgap structures'.

The two diffracting lattices 18 and 19 are here designed in such a way as to have (at least) an energy band which is forbidden to certain light photons which are emitted in the active waveguide 1. In that forbidden band there are at least two particular directions D1 and D2 (as illustrated in FIG. 7), for which reflection is particularly significant for certain wavelengths which are in the amplification band of the active waveguide. Accordingly the laser effect can be produced in those directions if the gain is sufficient. In this embodiment, it is the Bragg reflections in those two directions D1 and D2 which make it possible to obtain two different relaxation oscillation frequencies.

In other words the two diffracting lattices 18 and 19 jointly define a multitude of resonant cavities which extend in said directions D1 and D2 and make it possible to achieve lateral distributed stabilisation of the gain of the structure forming the optical amplifier.

Preferably the structuring 18, 19 extends at least over the whole of the length L1 of the active waveguide 1 and over all or part of the lateral extent of the part of the upper layer 3 which is placed above the lateral parts of the passive waveguide 4, which are disposed on respective sides of the active waveguide 1. It is in fact important for the structuring to extend substantially over the width of the optical mode or at least over a part thereof.

In the example illustrated in FIGS. 5 to 7 the structuring 18, 19 defines a photonic crystal of holes 20 which extend substantially in the vertical direction (axis Y) and constitute diffracting elements which provide a periodic variation in the dielectric constant. Such holes 20 can be produced by means of etching procedures known to the man skilled in the art such as for example dry etching of nanometric patterns defined previously by electron beam lithography. That mode of production of the distributed reflector avoids the growth resumption steps which are often delicate and troublesome.

In an alternative configuration it would be possible to produce a photonic crystal of columns in place of the photonic crystal of holes.

That photonic crystal is preferably a paving arrangement of substantially contiguous convex polygons and share each of their edges with a single adjoining one. The number of periods along the axis Z and the pitch of the paving arrangement (or lattice) and the dimensions of the holes (or columns) are selected in dependence on the privileged reflection directions D1 and D2 and of course the wavelength of the photons in the guided mode (operating wavelength of the optical amplifier). That pitch is typically of the order of the wavelength of those photons. Moreover the type of paving arrangement (just like the pitch) is selected as a function of the particular directions D1 and D2 of the forbidden photonic band for which reflection is particularly significant for certain wavelengths.

As illustrated that type is preferably an equilateral triangle. However it could equally involve squares or diamonds, the edges of which are of substantially equal sizes.

In that type of equilateral triangular two-dimensional lattice the reflections are produced in the privileged directions D1 and D2 for wavelengths $\lambda_B$ which are determined by the Bragg condition $\lambda_B = n_{eff}\sqrt{3}\,a$, wherein $n_{eff}$ is the mean index of the structuring and a is the pitch of the lattice (or constant of the lattice).

Moreover the interaction length $L_c$ between the photons and the electrons is given by the relationship $$L_c = \frac{2n+1}{2}\sqrt{3}\,a,$$

for a guide of type Wn designating a photonic crystal in which n rows of holes have been removed. In the case (illustrated) of a guide involving a photonic crystal of type W2, the following is deduced from the preceding relationship:

$$L_c = \frac{5}{2}\sqrt{3}\,a.$$

It will be recalled that the two base vectors which define the mesh of a triangular crystal in real space are given by:

$$\vec{a}_1 = \frac{a}{2}\left(\vec{u}_x + \sqrt{3\vec{u}_z}\right) \quad \vec{a}_2 = \frac{a}{2}\left(\vec{u}_x - \sqrt{3\vec{u}_z}\right)$$

in which $\vec{u}_x$ and $\vec{u}_z$ are unitary vectors along the axes X and Z respectively.

Moreover the base vectors in reciprocal space are given by:

$$\vec{b}_1 = \frac{2\pi}{a}\left(\vec{u}_x + \sqrt{3\vec{u}_z}\right)/2 \quad \vec{b}_2 = \frac{2\pi}{a}\left(\vec{u}_x - \sqrt{3\vec{u}_z}\right)/2$$

It can be noted that it is also a triangular lattice in reciprocal space, with a rotation of 90° with respect to real space.

In addition the Bragg condition for an incident wave of vector $\vec{k}_i$ is given by the relationship:

$$\vec{k}_f = \vec{k}_i + \vec{G}$$

in which $\vec{k}_f$ is the wave vector for which diffraction is at a maximum and $\vec{G}$ is the wave vector in reciprocal space, given by the relationship:

$$\vec{G} = m\vec{b}_1 + n\vec{b}_2$$

in which m and n are both integers.

With those definitions a laser oscillation can be established when the following conditions are satisfied:

$$\vec{k}_f = -\vec{k}_i \quad \vec{k}_f = \vec{G}/2$$

A plurality of solutions satisfying the aforesaid laser oscillation conditions, there are therefore a plurality of privileged directions such as D1 (that is to say $\vec{b}_1$), and D2 (that is to say $\vec{b}_2$). In a triangular lattice of the type illustrated the angle between D1 and the axis z is 30° and the angle between D1 and D2 is 120°.

It will be apparent from the relationship referred to hereinbefore that there is a multiplicity of privileged directions (defined by all the combinations of m and n). However, it is easier to attain the laser oscillation conditions in the directions D1 and D2 by virtue of a strong reflection and a significant cavity length in those directions.

By way of illustrative example, for an operating wavelength of the CG-SOA of about 1.55 μm in air, the value of the pitch of the lattice a is about 450 nm.

For example, to obtain an emission wavelength of about 1.55 μm in air, with a device having an effective index of about 3.2, the pitch of the lattice must be about 450 nm, and the lateral extent (X) of the crystal must be at least to that of the transverse mode, that is to say typically 4 μm for each side. Moreover the separation distance d between the longitudinal (or lateral) sides of the active waveguide 1 and the photonic crystals 18 and 19 is typically of the order of a micrometer, for example between 0 and 2 μm, so as to permit a good interaction between the guided light and the holes.

Figure 8:
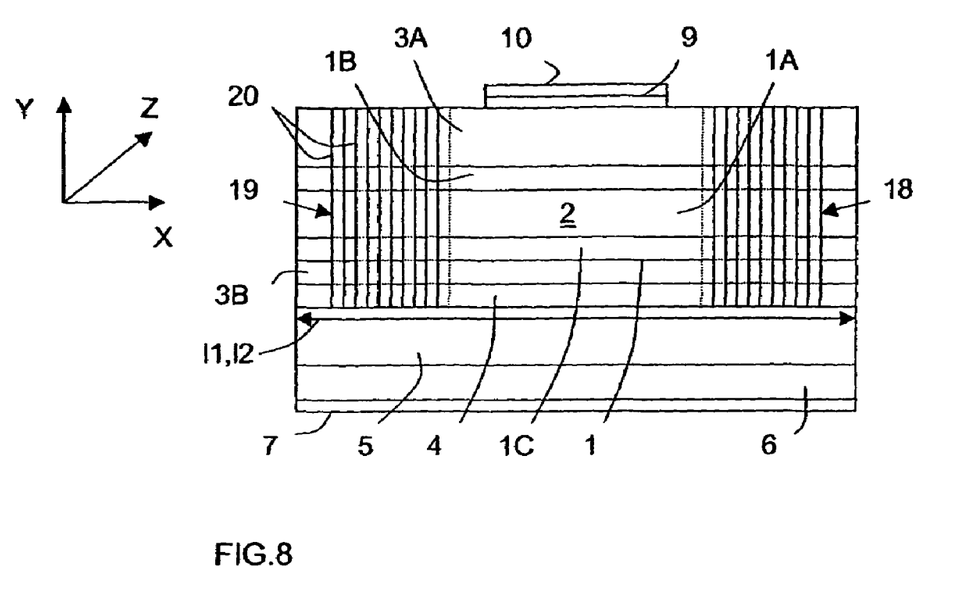
FIG. 8 is a diagrammatic view in cross-section in the plane (XY) of a variant of the second embodiment illustrated in FIG. 5.

Reference will now be made to FIG. 8 to describe a variant of the embodiment illustrated in FIGS. 5 to 7.

What distinguishes this embodiment from that described hereinbefore is the fact that the active waveguide 1 is no longer in the form of a band (which is possibly tapered) but it is in the form of a multi-layer structure of a width 12 substantially equal to the width 11 of the layer constituting the passive waveguide 4. Consequently the active waveguide 1 is no longer buried in a layer 3 but it is placed (in this example) between two layers 3A and 3B, the layer 3B here being placed above the passive waveguide 4.

The two diffracting lattices 18 and 19 are still formed along the longitudinal sides of the active waveguide 1 which are defined by the plane (YZ). In this variant however they are formed in a part at least of the layer 3A, in the layer 3B, in the passive waveguide 4, and in the active waveguide 1. In addition one or more rows of holes is or are removed from the structuring 18, 19 so that it defines the resonant cavities while ensuring lateral confinement of the carriers.

It is important to note that the layer 3B, the passive waveguide 4 and the layers 1B and 1C are optional. Consequently, when there is only an active waveguide 4, formed by the single active region 2 (or layer 1A), the diffracting lattices 18 and 19 are formed in a part at least of the layer 3A and in the active waveguide 1.

The invention is not limited to the embodiments described hereinbefore solely by way of example but it embraces all the variants that the man skilled in the art can envisage within the scope of the claims hereinafter.

The invention claimed is:

1. A stabilized gain semiconductor optical amplifier including an active waveguide comprising: an amplification medium, extending in longitudinal, lateral and vertical directions, and coupled to a laser oscillation structure, wherein said laser oscillation structure comprises at least two resonant cavities extending in first and second directions which are different from the longitudinal direction of the active waveguide and arranged in such a way as to permit the establishment of laser oscillations having at least two different relaxation oscillation frequencies and wherein said resonant cavities are formed at least in a passive waveguide which is placed below said active waveguide on respective sides of the longitudinal sides of said active waveguide.

2. The optical amplifier according to claim 1, wherein said resonant cavities have different optical path lengths.

3. The optical amplifier according to claim 1, wherein said resonant cavities are associated with different wavelengths.

4. The optical amplifier according to claim 1, wherein said resonant cavities and said active waveguide share at least in part said amplification medium.

5. The optical amplifier according to claim 1, wherein at least one of said resonant cavities comprises a multi-mode interference amplification structure.

6. The optical amplifier according to claim 1, wherein said resonant cavities are defined by distributed Bragg reflectors.

* * * * *